(12) United States Patent
Shimizu

(10) Patent No.: US 7,117,394 B2
(45) Date of Patent: Oct. 3, 2006

(54) BUILT-IN SELF-TEST CIRCUIT

(75) Inventor: Ryuji Shimizu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 569 days.

(21) Appl. No.: 10/436,132

(22) Filed: May 13, 2003

(65) Prior Publication Data
US 2004/0088621 A1    May 6, 2004

(30) Foreign Application Priority Data
May 22, 2002   (JP)   .............................. 2002-148343

(51) Int. Cl.
*G06F 11/00*   (2006.01)
(52) U.S. Cl. .................... 714/30; 714/33; 714/715; 714/718; 714/719
(58) Field of Classification Search ............ 714/30, 714/33, 715, 718, 719
See application file for complete search history.

(56) References Cited

U.S. PATENT DOCUMENTS 5,555,249 A * 9/1996 Hilley et al. ................ 714/718
5,557,619 A * 9/1996 Rapoport .................... 714/733
6,301,678 B1 * 10/2001 Sato et al. ................... 714/718

* cited by examiner

*Primary Examiner*—Robert Beausoliel
*Assistant Examiner*—Charles Ehne
(74) *Attorney, Agent, or Firm*—Arent Fox PLLC

(57) ABSTRACT

A built-in self-test (BIST) circuit is configured to divide data output bits of a RAM macro into a plurality of groups each consisting of 2 bits, and provide a 1-bit comparator of a signature analyzer for each group to share one 1-bit comparator by respective two data output bits. A selector of a bit changer sequentially selects a data output bit from each group, and the 1-bit comparator sequentially compares output data for the selected data output bit with expected value data.

13 Claims, 17 Drawing Sheets

FIG.15

| D[1] | D[0] | TEST TARGET |
|---|---|---|
| 0 | 0 | A PORT (EVEN BIT) |
| 0 | 1 | A PORT (ODD BIT) |
| 1 | 0 | B PORT (EVEN BIT) |
| 1 | 1 | B PORT (ODD BIT) |

BUILT-IN SELF-TEST CIRCUIT

CROSS-REFERENCE TO RELATED APPLICATIONS

This application is based upon and claims the benefit of priority from the prior Japanese Patent Application No.2002-148343, filed on May 22, 2002, the entire contents of which are incorporated herein by reference.

BACKGROUND OF THE INVENTION

1. Field of the Invention

The present invention relates to a BIST circuit for conducting a test on memory using a comparator-type signature analyzer.

2. Description of the Related Art

As one of test facilitating design techniques for large-scale integrated circuits (LSIs), there is a built-in self-test (BIST). This is for performing self diagnosis by providing a test circuit in the LSI and comparing a responded output of a circuit to be tested with respect to a test pattern generated by the test circuit, with an expected value.

FIG. 1 shows a block diagram of the configuration of a conventional random access memory built-in self-test (RAMBIST) circuit. As shown in FIG. 1, in a signature analyzer 1 of the conventional RAMBIST circuit, a 1-bit comparator 11 is provided for each of data output bits A[0] to A[n−1] in a RAM macro 2. In this configuration, the data output from each of the data output bits A[0] to A[n−1] in the RAM macro 2 is compared with expected value data generated by a data generator 3, for each corresponding bit by the 1-bit comparator 11. A controller 4 controls respective operations of the signature analyzer 1 and the data generator 3.

FIG. 2 shows a block diagram of another configuration of the conventional RAMBIST circuit. In the RAMBIST circuit shown in FIG. 2, a signature analyzer 1 is provided for each read port with respect to a multi-port type RAM macro 5 having a plurality of read ports (in the example shown in the figure, A and B ports). In this configuration, the data output from each read port of the RAM macro 5 is compared with the expected value data generated by a data generator 3, for each corresponding read port, by the respective signature analyzer 1. The controller 4 controls respective operations of the signature analyzers 1 and the data generator 3.

However, with a rapid progress of technology, the number of the RAM macros mounted on one chip is recently increasing. Accompanying this, the number of read ports and the number of data output bits increase considerably, causing a problem in that the chip area increases due to an increase in number of the signature analyzers.

SUMMARY OF THE INVENTION

The present invention has been achieved in order to solve the above problems. It is an object of this invention to provide a BIST circuit that can reduce the number of 1-bit comparators and signature analyzers, by sharing the 1-bit comparator between a plurality of data output bits and sharing the signature analyzer between read ports, thereby reducing the size (the number of gates).

In order to achieve the object, the BIST circuit according to one aspect of the present invention has a configuration such that data output bits of a circuit to be tested (RAM macro) are divided into a plurality of groups by a plurality of bits, a 1-bit comparator of a signature analyzer is provided for each group, the data output bit in each group is sequentially selected by a selector (a bit changer), and the output data for the selected data output bit is sequentially compared with the expected value data by the 1-bit comparator. According to this invention, the 1-bit comparator is shared with data output bits, and therefore the number of 1-bit comparators is reduced.

The BIST circuit according to another aspect of the present invention also has a configuration such that one signature analyzer is provided with respect to a plurality of data output ports of a circuit to be tested (RAM macro), the data output ports are sequentially selected by a selector (a port selector), and the output data from the selected data output port is sequentially compared with the expected value data by the signature analyzer. According to this invention, the signature analyzer is shared with data output ports, and therefore the number of signature analyzers is reduced.

Further, the BIST circuit according to still another aspect of the present invention is configured to have both the configuration in which one signature analyzer is shared with data output ports and the configuration in which one 1-bit comparator is shared with the data output bits. According to this invention, the signature analyzer is shared with the data output ports, and therefore the number of signature analyzers is reduced. Further, the 1-bit comparator is shared with the data output bits, and therefore the number of 1-bit comparators of each signature analyzer is reduced.

These and other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 15 shows one example of relations between an output signal of a 2-bit counter in the circuit shown in FIG. 14, and a bit to be tested.

DETAILED DESCRIPTION

Embodiments of the present invention are explained below in detail with reference to the accompanying drawings.

Figure 3:
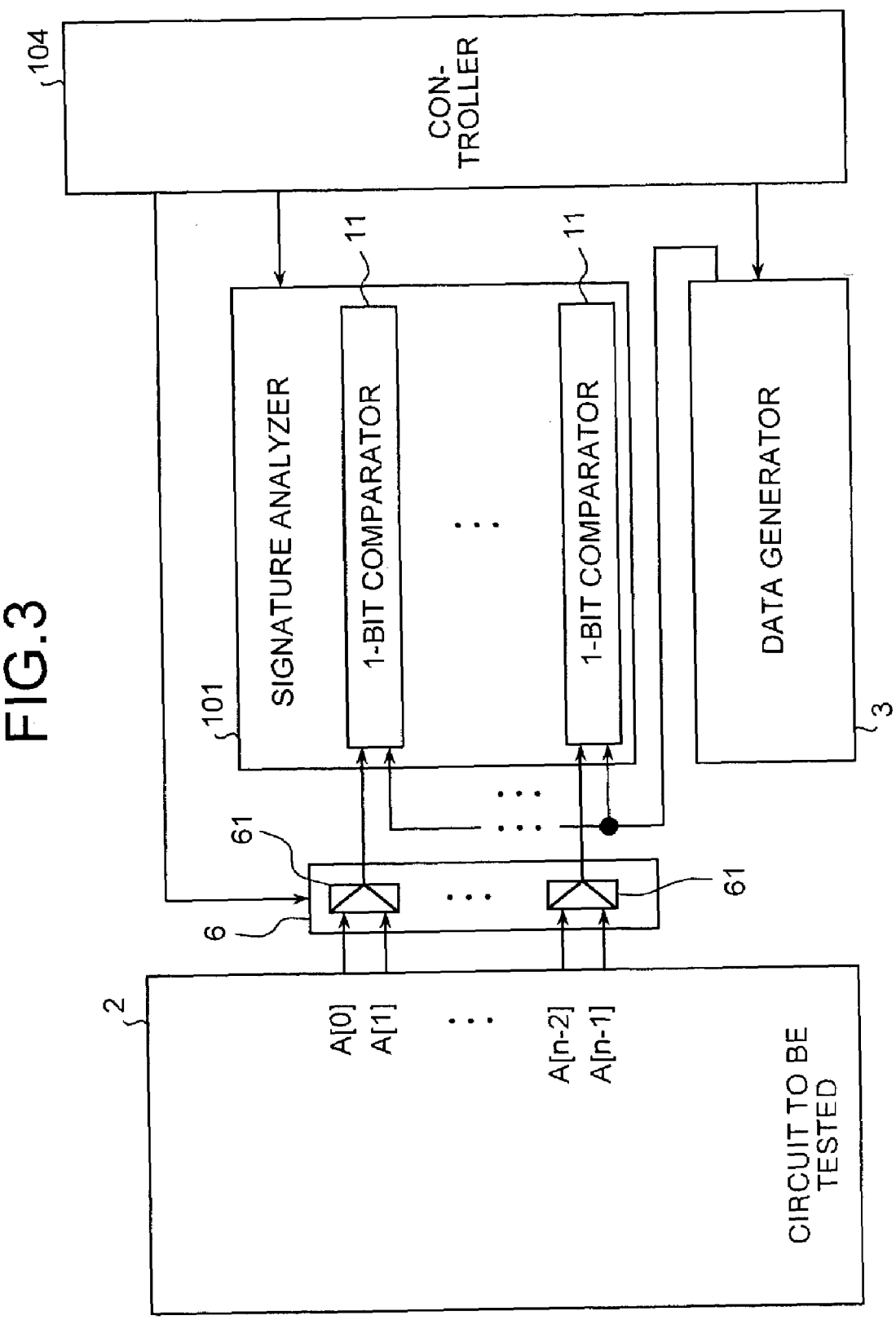
FIG. 3 shows a block diagram of the configuration of a RAMBIST circuit according to a first embodiment of the present invention.

FIG. 3 shows a block diagram of the configuration of a RAMBIST circuit according to a first embodiment of the present invention. As shown in FIG. 3, the RAMBIST circuit comprises a signature analyzer 101, a data generator 3, a controller 104, and a bit changer 6 provided with selectors.

Data output bits, A[0] to A[n−1], of a RAM macro 2 as a circuit to be tested are grouped by, for example, 2 bits though not particularly limited, and divided into n/2 groups. The bit changer 6 has n/2 selectors 61, each of which individually corresponds to each group of the data output bits. In other words, each selector 61 selects either one of two data output bits in each group for the data output bits.

The signature analyzer 101 has n/2 1-bit comparators 11. Each of the 1-bit comparators 11 individually corresponds to each of the selectors 61. Therefore, either one of two data output bits in a group corresponding to the data output bits is supplied to each 1-bit comparator 11 via a corresponding selector 61. The operation of the signature analyzer 101 is controlled by the controller 104.

The data generator 3 generates expected value data under the control of the controller 104, and supplies the generated expected value data to each 1-bit comparator 11. The controller 104 controls the selector 61 to select the data output bit.

Figure 4:
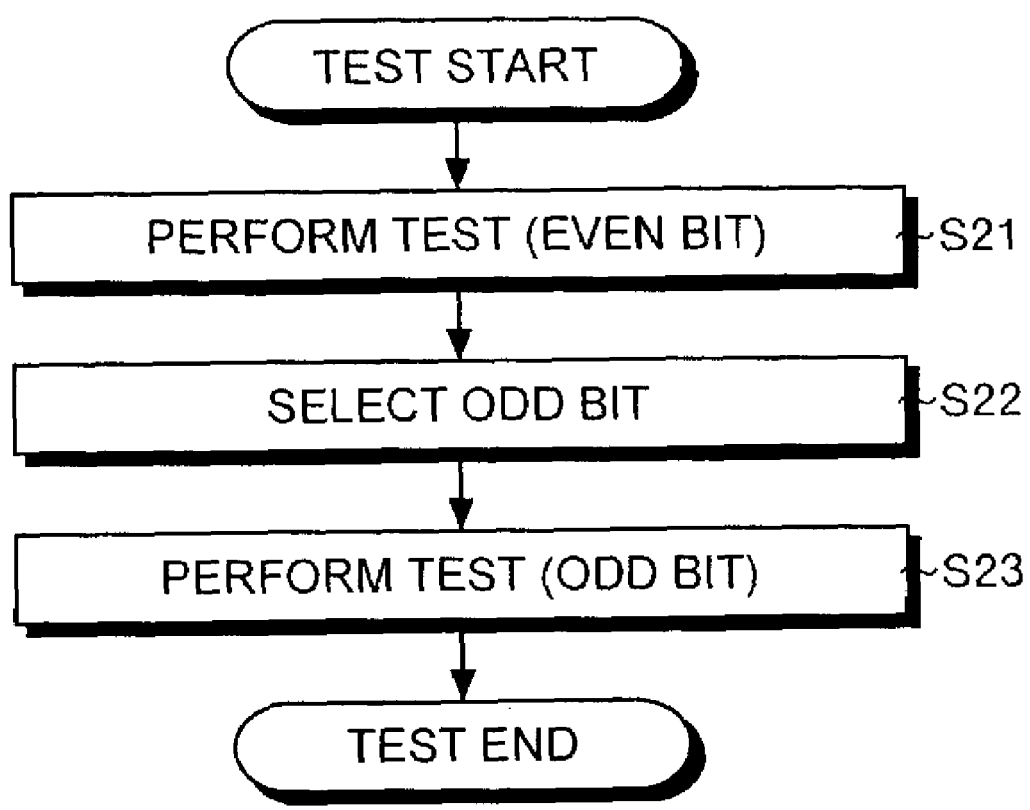
FIG. 4 is a flowchart showing one example of a test sequence executed in the RAMBIST circuit according to the first embodiment.

FIG. 4 is a flowchart showing one example of a test sequence executed in the RAMBIST circuit according to the first embodiment. When test is started, for example, even bits of the RAM macro 2 are first selected by the bit changer 6, and the test on the even bits is executed (step S21). After the test on the even bits is ended, for example, odd bits of the RAM macro 2 are selected by the bit changer 6 (step S22). The test is then carried out on the odd bits (step S23), thereby ending the test.

Figure 5:
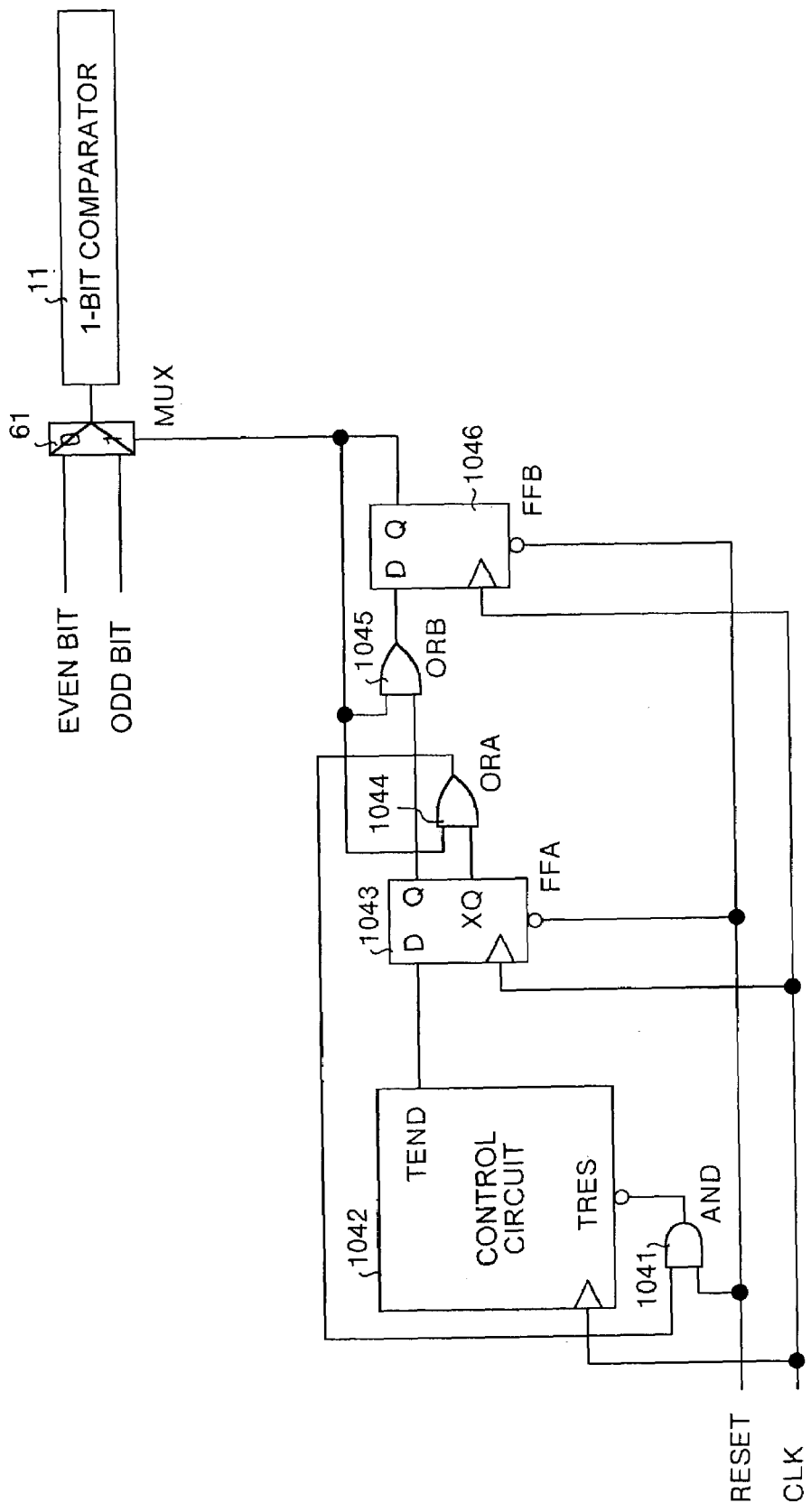
FIG. 5 is a circuit diagram showing one example of the configuration of a circuit for controlling a bit changer of the RAMBIST circuit according to the first embodiment.

FIG. 5 is a circuit diagram showing one example of the configuration of a circuit for controlling the bit changer 6. As shown in FIG. 5, this circuit comprises an AND gate 1041 (hereinafter referred to as AND), a control circuit 1042, a first flip flop (hereinafter referred to as FFA) 1043, a first OR gate (hereinafter referred to as ORA) 1044, a second OR gate (hereinafter referred to as ORB) 1045, and a second flip flop (hereinafter referred to as FFB) 1046.

A reset signal RESET supplied from outside and an output signal of the ORA 1044 are input to the AND 1041. The output signal of the AND 1041 is input to a low active reset terminal TRES of the control circuit 1042. A test end signal is output from an output terminal TEND of the control circuit 1042. The test end signal output of the control circuit 1042 is input to an input terminal D of the FFA 1043.

A signal output from an output terminal Q of the FFA 1043 is input to one of the input terminals of the ORB 1045. Further, a signal output from an output terminal XQ of the FFA 1043 is input to one of the input terminals of the ORA 1044. An inverted signal of the signal output from the output terminal Q is output from the output terminal XQ. A signal output from an output terminal Q of the FFB 1046 is input to the other input terminals of the ORA 1044 and the ORB 1045, respectively. An output signal of the ORB 1045 is input to an input terminal D of the FFB 1046.

A signal output from the output terminal Q of the FFB 1046 is supplied to each selector 61 of the bit changer 6, as a switchover signal MUX. Each selector 61 selects an even bit of the data output bits of the RAM macro 2, when the switchover signal MUX is low, that is "0", in which a potential level is relatively low, and selects an odd bit when the switchover signal MUX is high, that is "1", in which a potential level is relatively high. The relation between the switchover signal MUX and the selected bit may be reversed.

The reset signal RESET is input to each low-activated reset terminal of the FFA 1043 and the FFB 1046. The reset signal RESET is a signal for initializing the whole BIST circuit. A clock signal CLK is supplied to each clock terminal of the control circuit 1042, FFA 1043, and FFB 1046 from outside.

Figure 6:
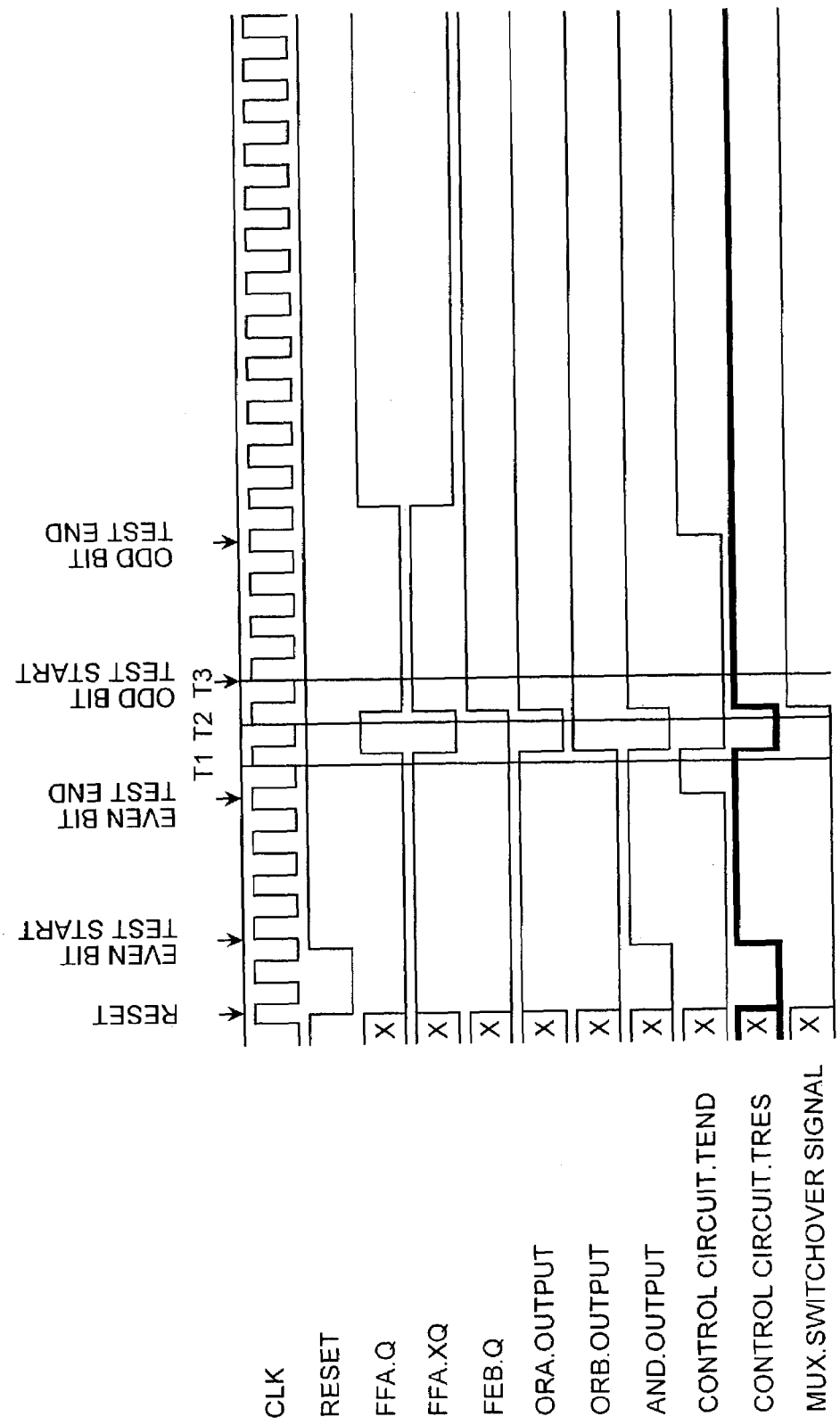
FIG. 6 is a timing chart of the operation timing of the circuit shown in FIG. 5.

FIG. 6 shows a timing chart of the operation timing of the circuit shown in FIG. 5. At first, the output signal from the output terminal Q (hereinafter referred to as a Q output signal) becomes low and the output signal from the output terminal XQ (hereinafter referred to as an XQ output signal) of the FFA 1043, becomes high, in synchronization with a falling edge of the reset signal RESET from high to low. The Q output signal of the FFB 1046, that is, the switchover signal MUX becomes low. The output signal of the ORA 1044 becomes high, and the output signal of the ORB 1045 becomes low. The output signal of the AND 1041, that is, the input signal to the reset terminal TRES of the control circuit 1042 becomes low. Further, the output signal from the output terminal TEND of the control circuit 1042, that is, the test end signal becomes low.

Subsequently, in synchronization with a rising edge of the reset signal RESET, the input signal to the reset terminal TRES of the control circuit 1042 (the output signal of the AND 1041) becomes high, but the potential level of other signals is not changed. At this point in time, a test on, for example, the even bit of the data output bits of the RAM macro 2 is started. After the passage of several clocks, the test on the even bits is ended, and the test end signal becomes high.

After the passage of one clock from the end of the test on the even bits (at a timing indicated by T1 in FIG. 6), the Q output signal of the FFA 1043 becomes high and the XQ output signal therefrom becomes low, respectively. The output signal of the ORA 1044 becomes low, and the input signal to the reset terminal TRES of the control circuit 1042 becomes low. The test end signal also returns to low. The output signal of the ORB 1045 becomes high. The switchover signal MUX (the Q output signal of the FFB 1046) remains low.

After the passage of another one clock (at a timing indicated by T2 in FIG. 6), the Q output signal of the FFA 1043 becomes low, and the XQ output signal thereof becomes high. The output signal of the ORA 1044 becomes high, and the input signal to the reset terminal TRES of the control circuit 1042 becomes high. As a result, the reset of the control circuit 1042 is released. The test end signal remains low, while the output signal of the ORB 1045 remains high. The switchover signal MUX (the Q output signal of the FFB 1046) changes to high.

After further passage of one clock (at a timing indicated by T3 in FIG. 6), a test on, for example, the odd bits of the data output bits of the RAM macro 2 is started. In response to end of the test on the odd bits, the test end signal becomes high. After the passage of one clock since then, the Q output signal and XQ output signal of the FFA 1043 change to respective levels. The potential level of other signals remains as it is.

Figure 1:
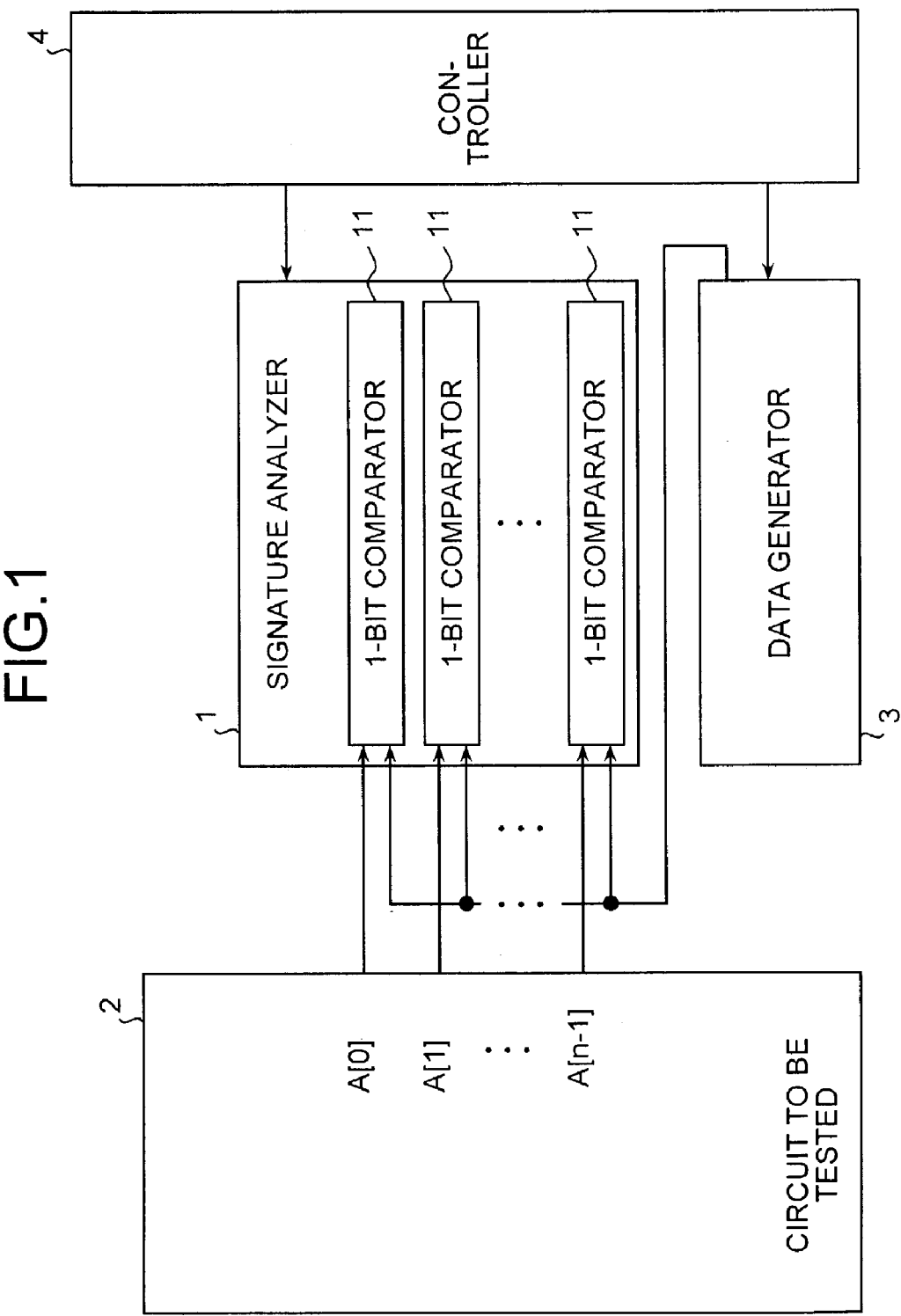
FIG. 1 shows a block diagram of the configuration of a conventional RAMBIST circuit having a 1-bit comparator for each data output bit.

According to the first embodiment described above, the number of 1-bit comparators 11 decreases by sharing one 1-bit comparator 11 with two data output bits of the RAM macro 2. Therefore, the size (the number of gates) of the BIST circuit can be reduced. Specifically, in the first embodiment, about 15% to 40% of the number of gates can be reduced as compared with the conventional configuration in which the 1-bit comparator is provided for each data output bit (see FIG. 1).

In the first embodiment, after the test on the odd bits is carried out first, of the data output bits of the RAM macro 2, the test on the even bits may be carried out. Alternatively, the configuration may be such that one 1-bit comparator 11 is shared with at least three data output bits of the RAM macro 2.

Figure 7:
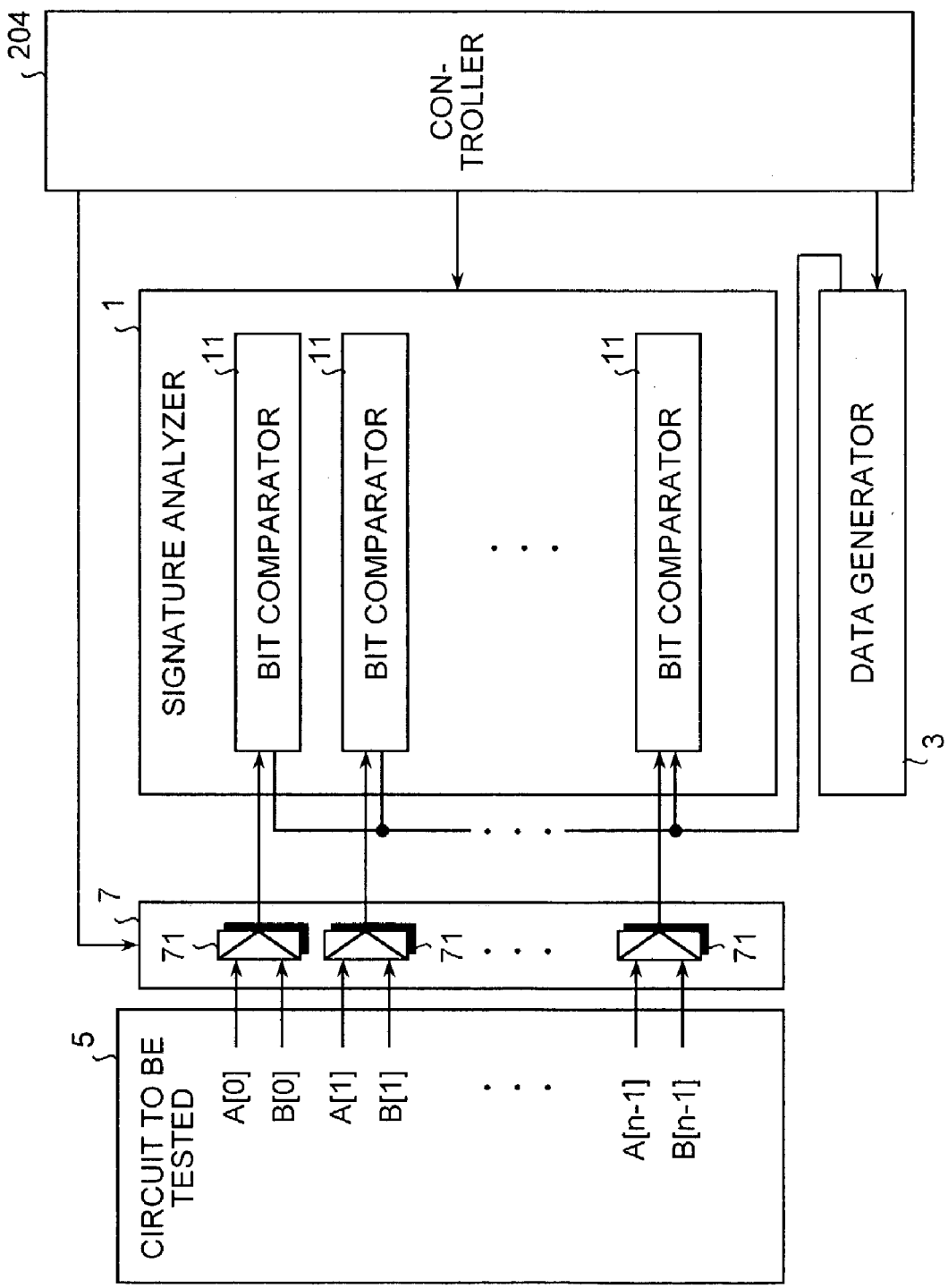
FIG. 7 shows a block diagram of the configuration of a RAMBIST circuit according to a second embodiment of the present invention.

FIG. 7 shows a block diagram of the configuration of a RAMBIST circuit according to a second embodiment of the present invention. As shown in FIG. 7, the RAMBIST circuit comprises a signature analyzer 1, a data generator 3, a controller 204, and a port selector 7 provided with at least one selector. For example, the port selector 7 is provided with one selector 71. The selector 71 selects either the data output from a read port A or the data output from a read port B of the RAM macro 5 as a circuit to be tested.

The signature analyzer 1 is provided with one bit comparator for one selector 71. The data output from the read port A or the data output from the read port B is supplied to the signature analyzer 1 via the selector 71. The data generator 3 generates expected value data under the control of the controller 204, and supplies the generated expected value data to the signature analyzer 1. The controller 204 controls the signature analyzer 1 to operate, and controls the selector 71 to select either of the read ports.

Figure 8:
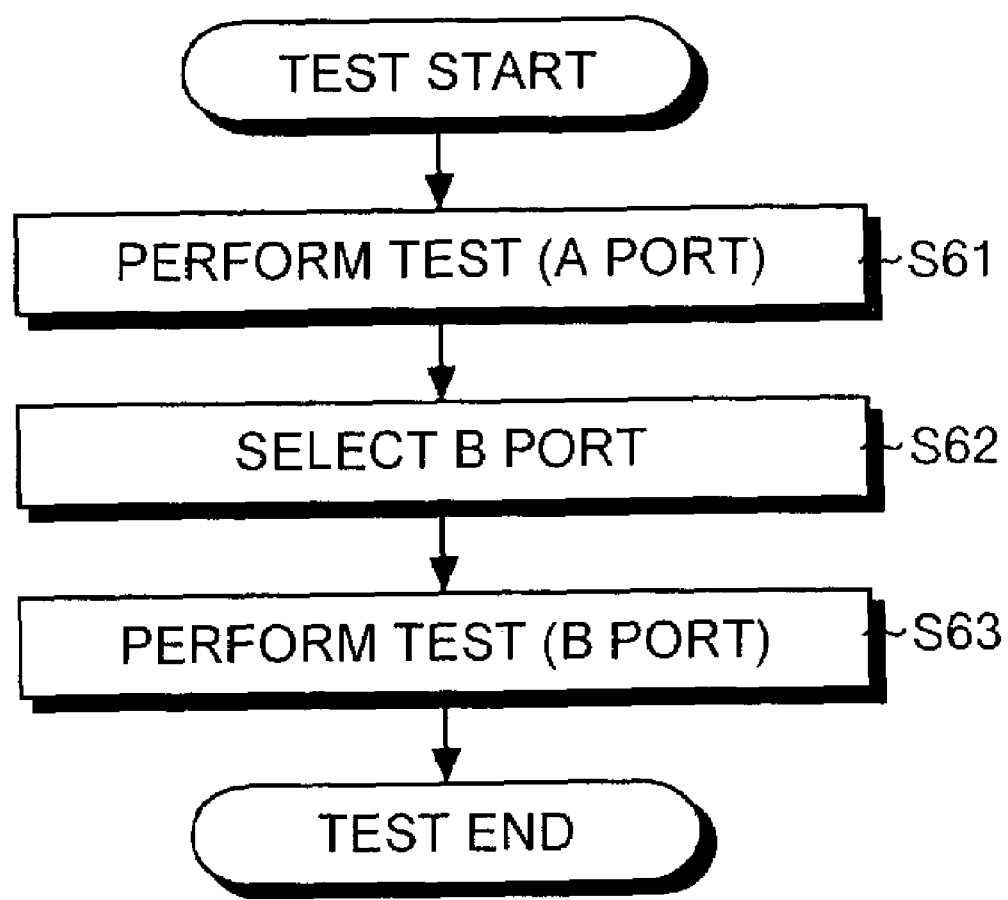
FIG. 8 is a flowchart showing one example of a test sequence executed in the RAMBIST circuit according to the second embodiment.

FIG. 8 is a flowchart showing one example of a test sequence executed in the RAMBIST circuit according to the second embodiment. When the test is started, for example, the read ports A of the RAM macro 5 are first selected by the port selector 7, and the test on the read ports A is executed (step S61). After the test on the read ports A is ended, for example, the read ports B of the RAM macro 5 are selected by the port selector 7 (step S62). The test is then carried out on the read ports B (step S63), thereby ending the test.

Figure 9:
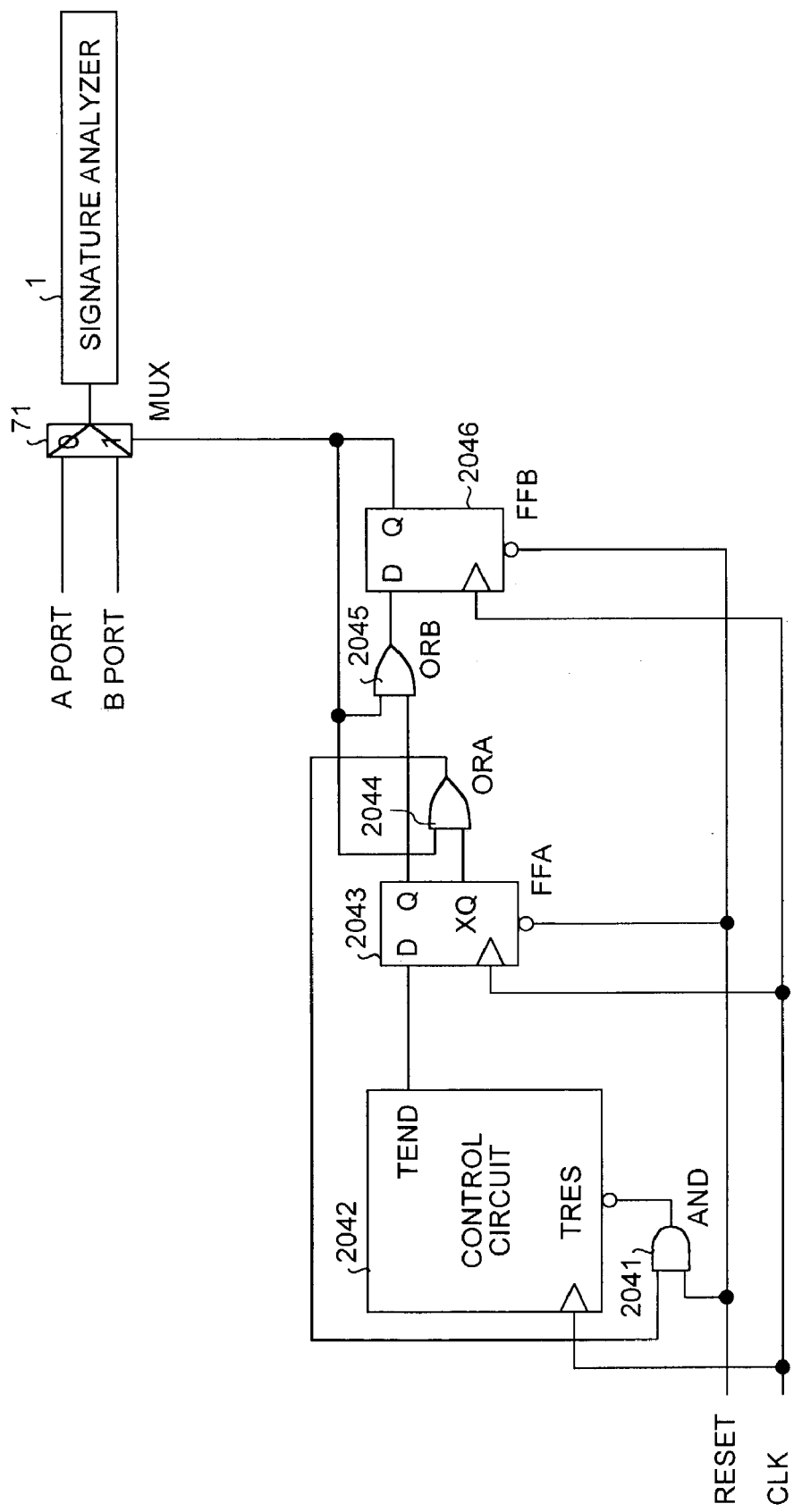
FIG. 9 is a circuit diagram showing one example of the configuration of a circuit for controlling a port selector of the RAMBIST circuit according to the second embodiment.

FIG. 9 is a circuit diagram showing one example of the circuit configuration of the controller 204 for controlling the port selector 7. As shown in FIG. 9, this circuit comprises an AND gate 2041 (hereinafter referred to as AND), a control circuit 2042, a first flip flop (hereinafter referred to as FFA) 2043, a first OR gate (hereinafter referred to as ORA) 2044, a second OR gate (hereinafter referred to as ORB) 2045, and a second flip flop (hereinafter referred to as FFB) 2046.

A reset signal RESET supplied from outside and an output signal of the ORA 2044 are input to the AND 2041. The output signal of the AND 2041 is input to a low active reset terminal TRES of the control circuit 2042. A test end signal is output from an output terminal TEND of the control circuit 2042. The test end signal output of the control circuit 2042 is input to an input terminal D of the FFA 2043.

A Q output signal of the FFA 2043 is input to one of the input terminals of the ORB 2045. Further, an XQ output signal of the FFA 2043 is input to one of the input terminals of the ORA 2044. A Q output signal of the FFB 2046 is input to the other input terminals of the ORA 2044 and the ORB 2045, respectively. An output signal of the ORB 2045 is input to an input terminal D of the FFB 2046.

The Q output signal of the FFB 2046 is input to the selector 71 in the port selector 7, as a switchover signal MUX. Each selector 71 selects the read port A of the RAM macro 5, for example, when the switchover signal MUX is low, and selects the read port B when the switchover signal MUX is high. The relation between the switchover signal MUX and the selected port may be reversed.

The reset signal RESET is input to each reset terminal of the FFA 2043 and the FFB 2046, for initializing the whole BIST circuit. A clock signal CLK is supplied to each clock terminal of the FFA 2043 and the FFB 2046 from outside.

Figure 10:
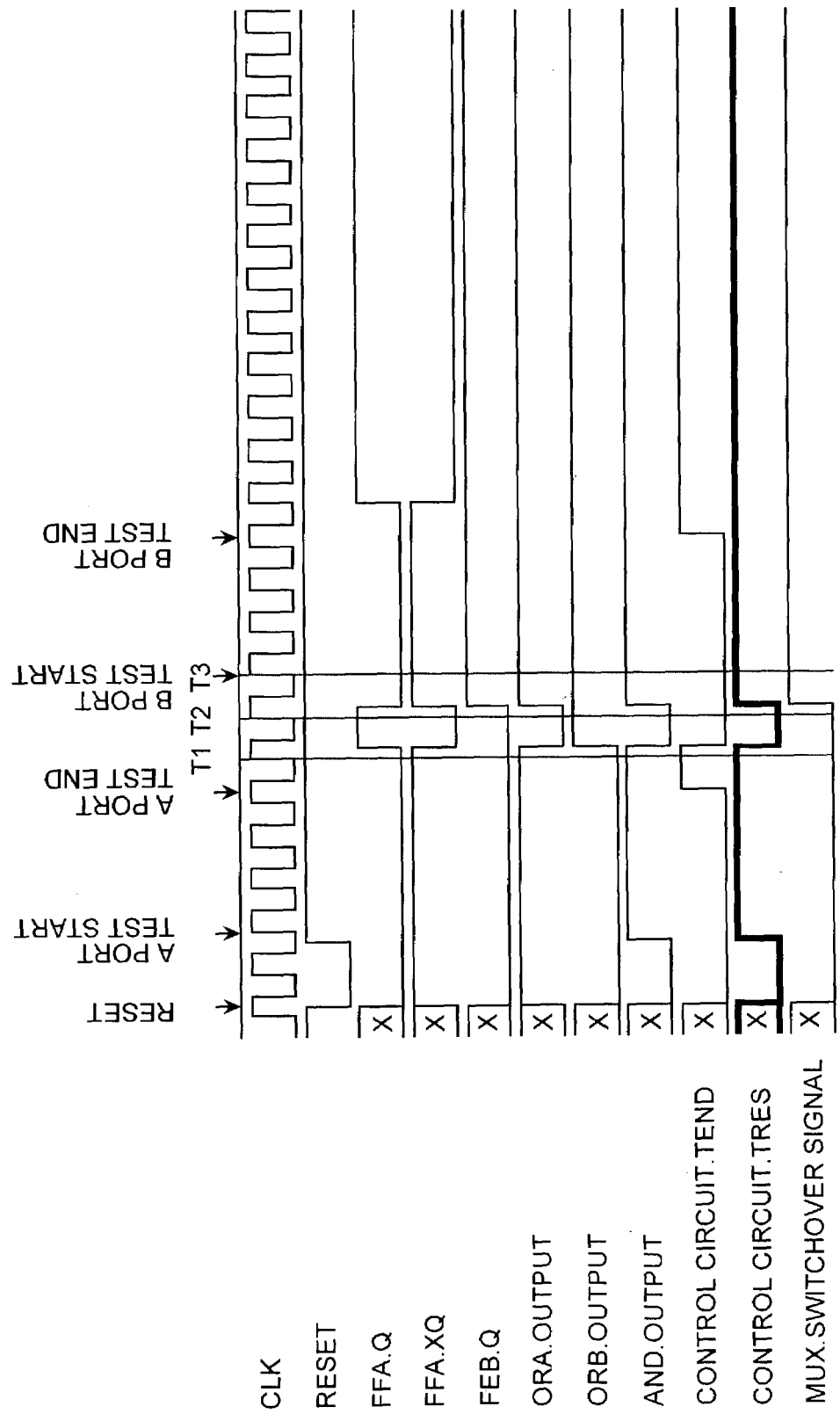
FIG. 10 is a timing chart of the operation timing of the circuit shown in FIG. 9.
Figure 11:
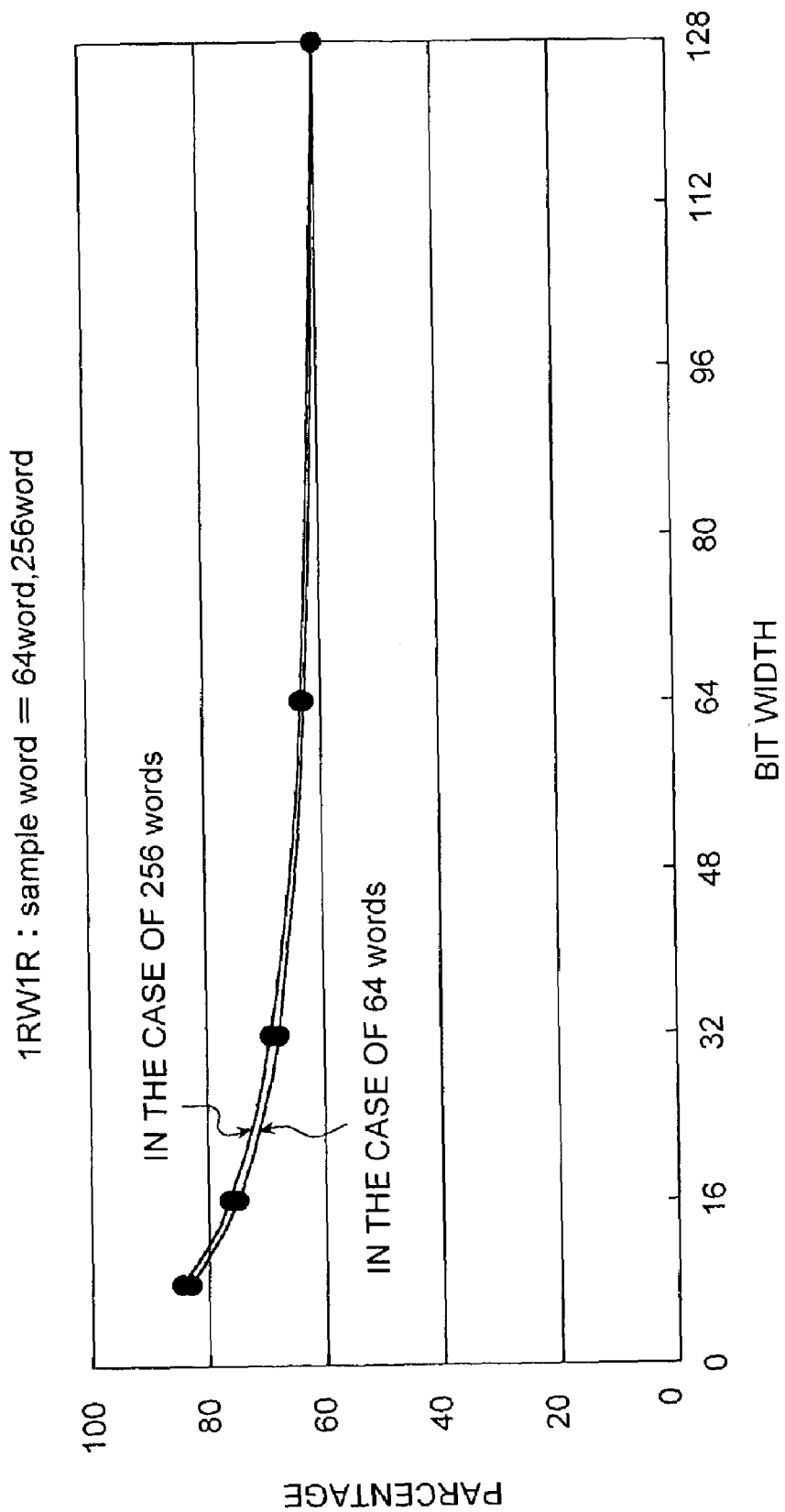
FIG. 11 is a graph of an effect due to reduction of a gate number of the RAMBIST circuit according to the second embodiment.

FIG. 10 is a timing chart of the operation timing of the circuit shown in FIG. 9. At first, in synchronization with a falling edge of the reset signal RESET, the Q output signal of the FFA 2043 becomes low, and the XQ output signal thereof becomes high. The Q output signal of the FFB 2046 serving as the switchover signal MUX, becomes low. The output signal of the ORA 2044 becomes high, and the output signal of the ORB 2045 becomes low. The output signal of the AND 2041, which becomes the input signal to the reset terminal TRES of the control circuit 2042, becomes low. Further, the test end signal output from the output terminal TEND of the control circuit 2042 becomes low.

Subsequently, in synchronization with a rising edge of the reset signal RESET, the input signal to the reset terminal TRES of the control circuit 2042 (the output signal of the AND 2041) becomes high. The potential level of other signals remains as it is. At this point in time, a test on, for example, the read port A of the RAM macro 5 is started. After the passage of several clocks, the test on the read ports A is ended, and the test end signal becomes high.

After the passage of one clock since the test on the read ports A is ended (at a timing indicated by T1 in FIG. 10), the Q output signal of the FFA 2043 becomes high and the XQ output signal thereof becomes low. The output signal of the ORA 2044 becomes low, and the input signal to the reset terminal TRES of the control circuit 2042 becomes low. The test end signal also returns to low. The output signal of the ORB 2045 becomes high. The switchover signal MUX (the Q output signal of the FFB 2046) remains low.

After the passage of another one clock (at a timing indicated by T2 in FIG. 10), the Q output signal of the FFA 2043 becomes low and the XQ output signal thereof becomes high. The output signal of the ORA 2044 becomes high, and the input signal to the reset terminal TRES of the control circuit 2042 becomes high. As a result, the reset of the control circuit 2042 is released. The test end signal remains low. The output signal of the ORB 2045 remains high. The switchover signal MUX (the Q output signal of the FFB 2046) changes to high.

Further, after further passage of one clock (at a timing indicated by T3 in FIG. 10), a test on, for example, the read port B of the RAM macro 5 is started. When the test on the read ports B is ended, the test end signal becomes high. After the passage of one clock since then, the Q output signal and XQ output signal of the FFA 2043 change to the respective levels. The potential level of other signals remains as it is.

Figure 2:
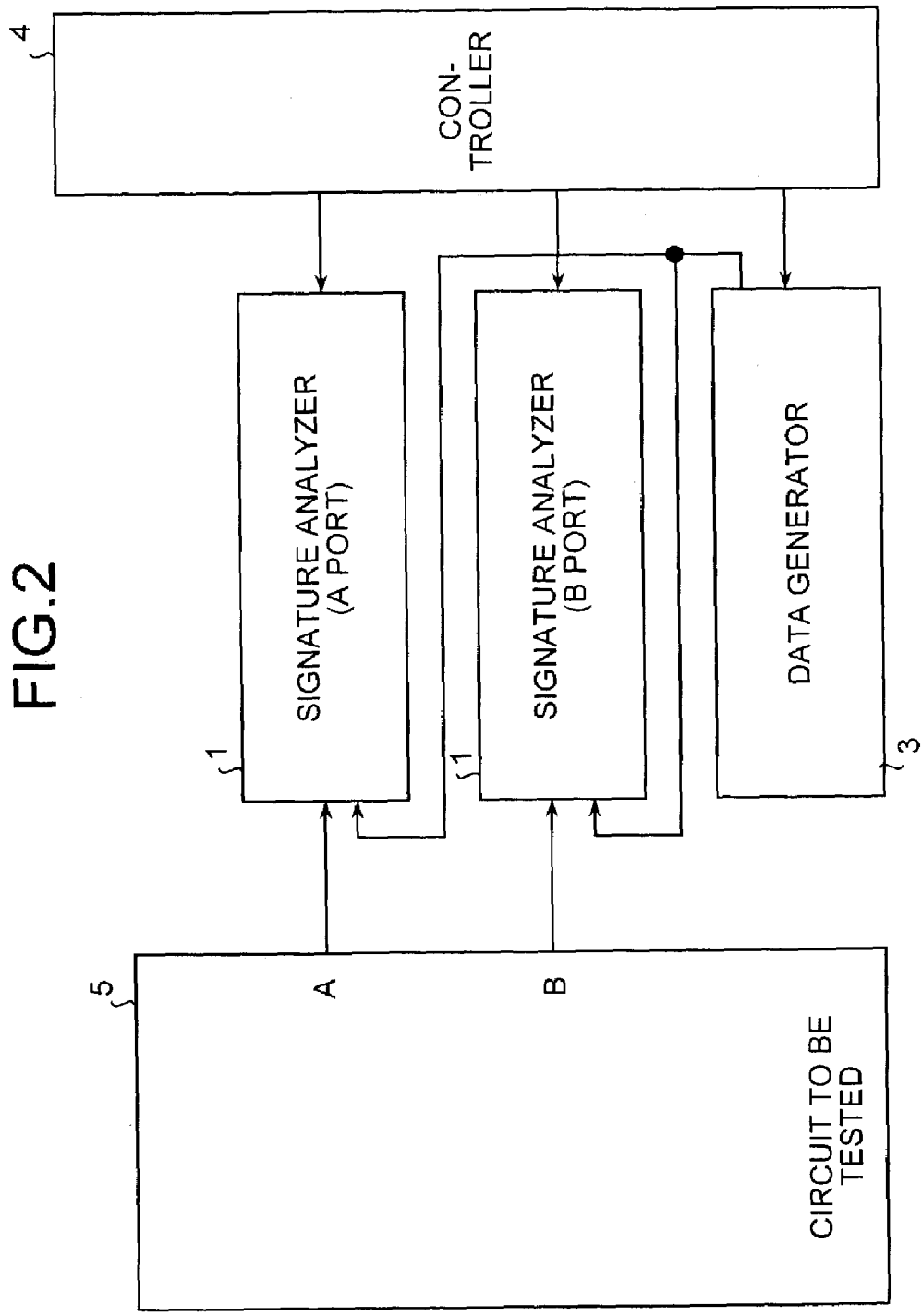
FIG. 2 shows a block diagram of the configuration of a conventional RAMBIST circuit having a signature analyzer for each read port.

According to the second embodiment described above, the number of signature analyzers 1 decreases by sharing one signature analyzer 1 with two read ports of the RAM macro 5. As a result, the size (the number of gates) of the BIST circuit can be reduced. Specifically, in the second embodiment, about 15% to 40% of the number of gates can be reduced as compared with the conventional configuration in which one signature analyzer is provided for each read port (see FIG. 2).

In the second embodiment, the test on the read ports B of the RAM macro 5 is carried out first, and then the test on the read ports A may be carried out. Alternatively, the configuration may be such that one signature analyzer 1 is shared with at least three read ports of the RAM macro 5.

Figure 12:
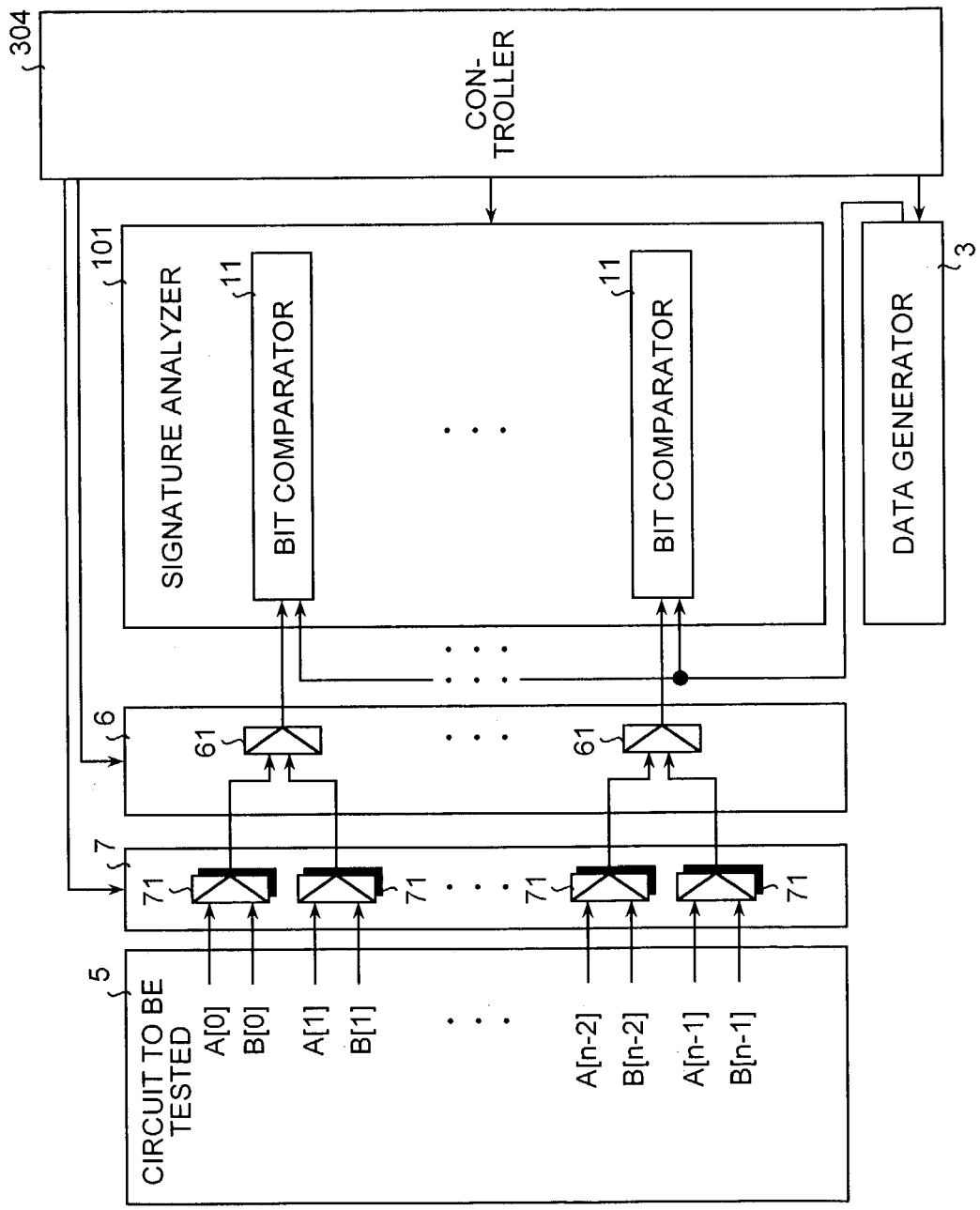
FIG. 12 shows a block diagram of the configuration of a RAMBIST circuit according to a third embodiment of the present invention.

FIG. 12 shows a block diagram of the configuration of a RAMBIST circuit according to a third embodiment of the present invention. As shown in FIG. 12, the RAMBIST circuit of the third embodiment has both the configurations of the first embodiment and the second embodiment. That is, the RAMBIST circuit has a configuration, as that of the second embodiment, such that either the data output from the read port A or the data output from the read port B of the RAM macro 5, is selected by the selector 71 as a first selector of the port selector 7.

Further, the RAMBIST circuit has a configuration, as that of the first embodiment, such that data output bits of the port selector 7 are grouped by 2 bits, and either one of the two data output bits in each group is selected by each selector 61 as a second selector of the bit changer 6, and supplied to each 1-bit comparator 11 of the signature analyzer 101. The same reference symbols are assigned to components the same as those of the first embodiment or the second embodiment, and the explanation thereof is omitted.

A controller 304 controls each selector 71 of the port selector 7 to select one of the read ports, and controls each selector 61 of the bit changer 6 to select one of the data output bits. The controller 304 also controls the respective operations of the signature analyzer 101 and the data generator 3.

Figure 13:
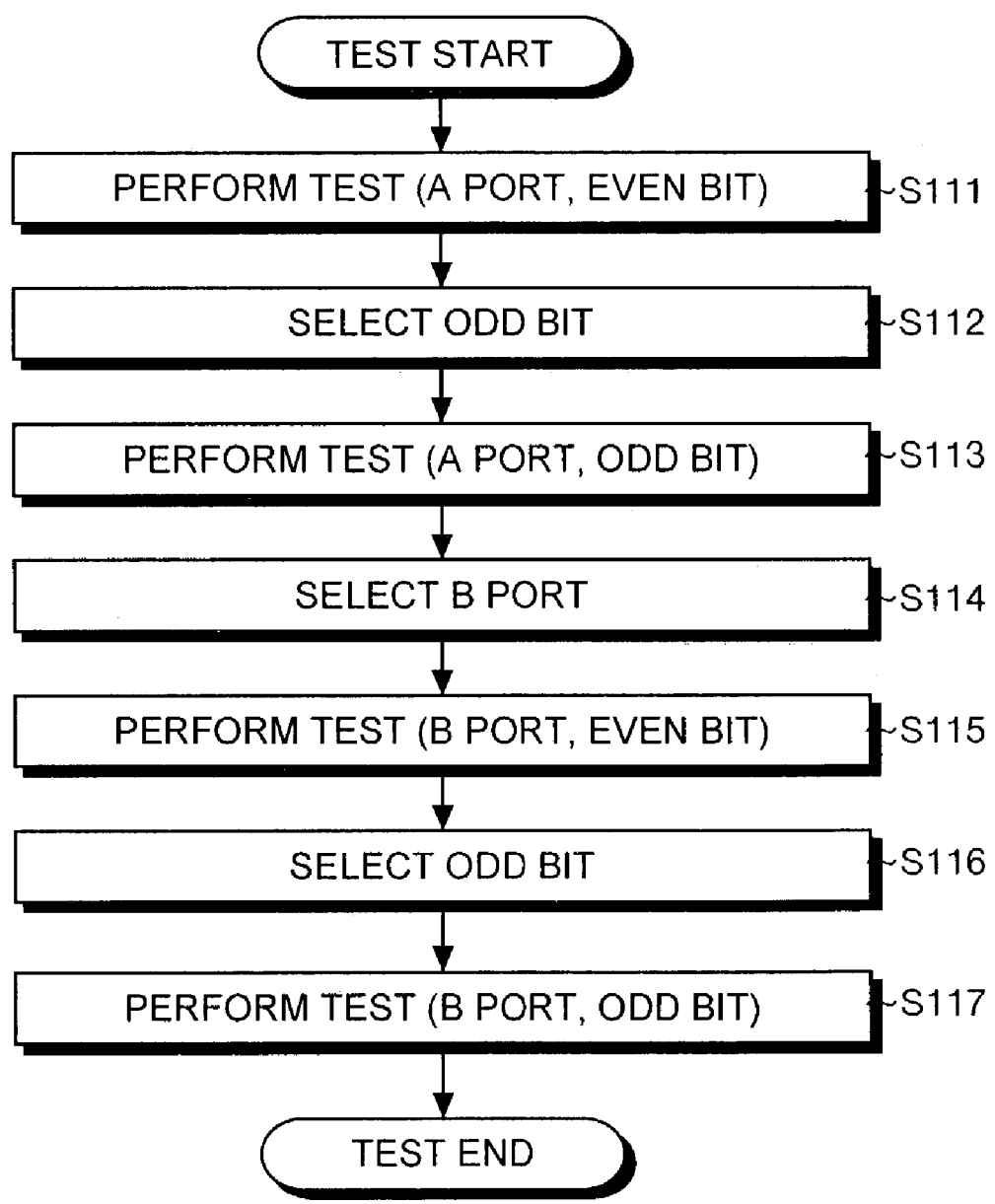
FIG. 13 is a flowchart showing one example of a test sequence executed in the RAMBIST circuit according to the third embodiment.

FIG. 13 is a flowchart showing one example of a test sequence executed in the RAMBIST circuit according to the third embodiment. When the test is started, for example, the read ports A of the RAM macro 5 are first selected by the port selector 7, and for example, even bits in the port selector 7 are selected by the bit changer 6. The test is then executed on the even bits of the read ports A (step S111). After the test on the even bits is ended, for example, odd bits of the port selector 7 are selected by the bit changer 6 (step S112). The test is then carried out on the odd bits of the read ports A (step S113).

After the test on the odd bits of the read ports A is ended, for example, the read ports B of the RAM macro 5 are selected by the port selector 7 (step S114). For example, even bits in the port selector 7 are selected by the bit changer 6. The test on the even bits of the read ports B is then carried out (step S115). After the test on the even bits is ended, for example, odd bits in the port selector 7 are selected by the bit changer 6 (step S116). The test is then carried out on the odd bits of the read ports B (step S117), thereby ending the test.

Figure 14:
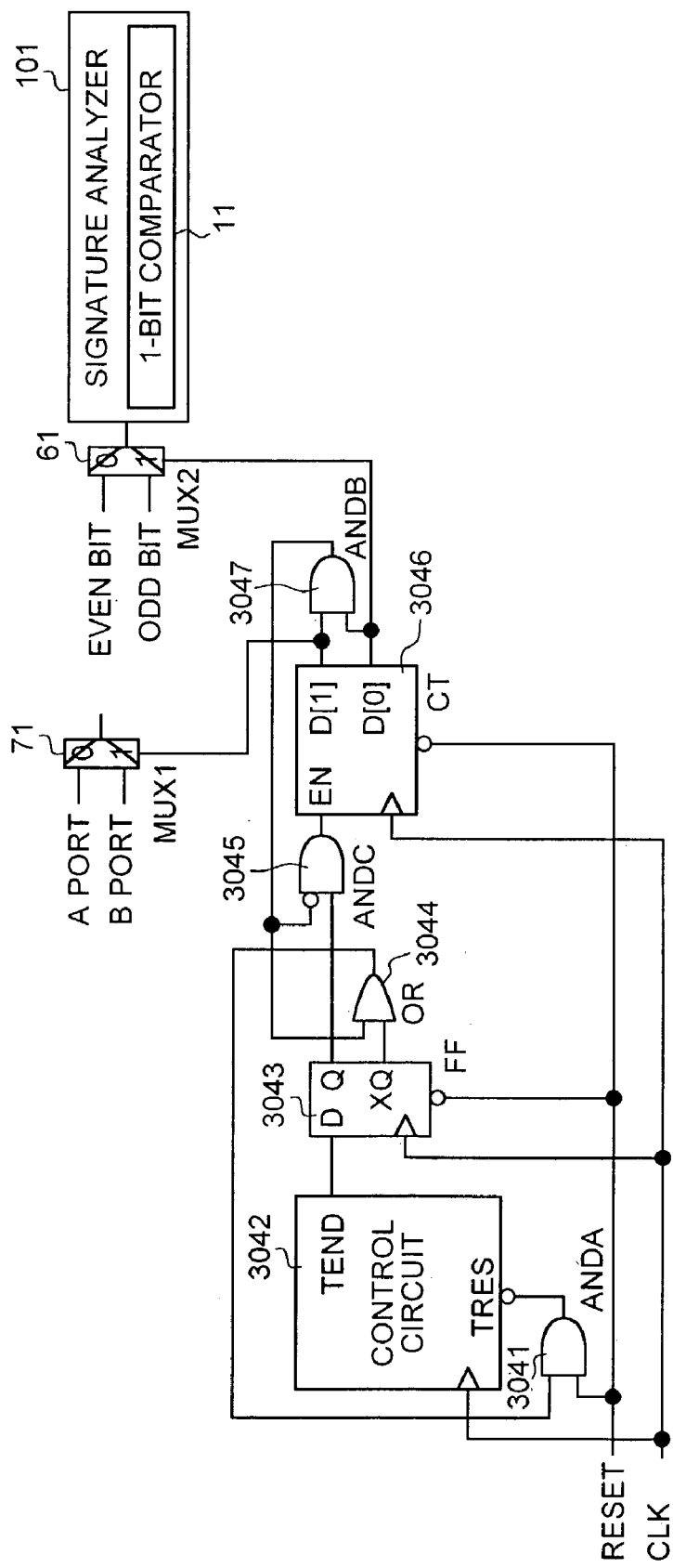
FIG. 14 is a circuit diagram showing one example of the configuration of a circuit for controlling a bit changer and a port selector of the RAMBIST circuit according to the third embodiment.

FIG. 14 is a circuit diagram showing one example of the circuit configuration of the controller 304 for controlling the bit changer 6 and the port selector 7. As shown in FIG. 14, this circuit comprises a first AND gate 3041 (hereinafter referred to as ANDA), a control circuit 3042, a flip flop (hereinafter referred to as FF) 3043, an OR gate (hereinafter referred to as OR) 3044, a second AND gate (hereinafter referred to as ANDB) 3047, a third AND gate (hereinafter referred to as ANDC) 3045, and a 2-bit counter (hereinafter referred to as CT) 3046.

A reset signal RESET supplied from outside and an output signal of the OR 3044 are input to the ANDA 3041. The output signal of the ANDA 3041 is input to a low active reset terminal TRES of the control circuit 3042. A test end signal is output from an output terminal TEND of the control circuit 3042 to be input to an input terminal D of the FF 3043.

An XQ output signal of the FF 3043 is input to one of the input terminals of the OR 3044. An output signal of the ANDB 3047 is input to the other input terminal of the OR 3044. A Q output signal of the FF 3043 is input to one of the input terminals of the ANDC 3045. An output signal of the ANDB 3047 is input to the other input terminal (low active) of the ANDC 3045. An output signal of the ANDC 3045 is input to an enable terminal EN of the CT 3046.

A signal output from one output terminal D[1] of the CT 3046 is supplied to the selector 71 of the port selector 7 as a first switchover signal MUX1, and also input to one of the input terminals of the ANDB 3047. The selector 71 selects, for example, the read ports A of the RAM macro 5 when the first switchover signal MUX1 is low, and selects the read ports B when the first switchover signal MUX1 is high. The relation between the first switchover signal MUX1 and the selected port may be reversed.

A signal output from the other output terminal D[0] of the CT 3046 is supplied to each selector 61 of the bit changer 6 as a second switchover signal MUX2, and also input to the other input terminal of the ANDB 3047. Each selector 61 selects, for example, even bits of the data output bits of the port selector 6 when the second switchover signal MUX2 is low, and selects odd bits when the second switchover signal MUX2 is high. The relation between the second switchover signal MUX2 and the selected bits may be reversed.

A reset signal RESET is input to each low active reset terminal of the FF 3043 and the CT 3046 to thereby initialize the whole BIST circuit. A clock signal CLK is supplied from outside to each clock terminal of the control circuit 3042, the FF 3043, and the CT 3046.

FIG. 15 shows one example of relations between each output signal from the output terminals D[1] and D[0] of the CT 3046, the read ports to be tested, and the data output bits. As shown in FIG. 15, if the output terminal D[1] and the output terminal D[0] are both "0", then the even bits of the read ports A are to be tested. For example, if the output terminal D[1] is "0" and the output terminal D[0] is "1", then the odd bits of the read ports A are to be tested. For example, if the output terminal D[1] is "1" and the output terminal D[0] is "0", then the even bits of the read ports B are to be tested. Further, if the output terminal D[1] and the output terminal D[0] are both "1", then the odd bits of the read ports B are to be tested.

Figure 16:
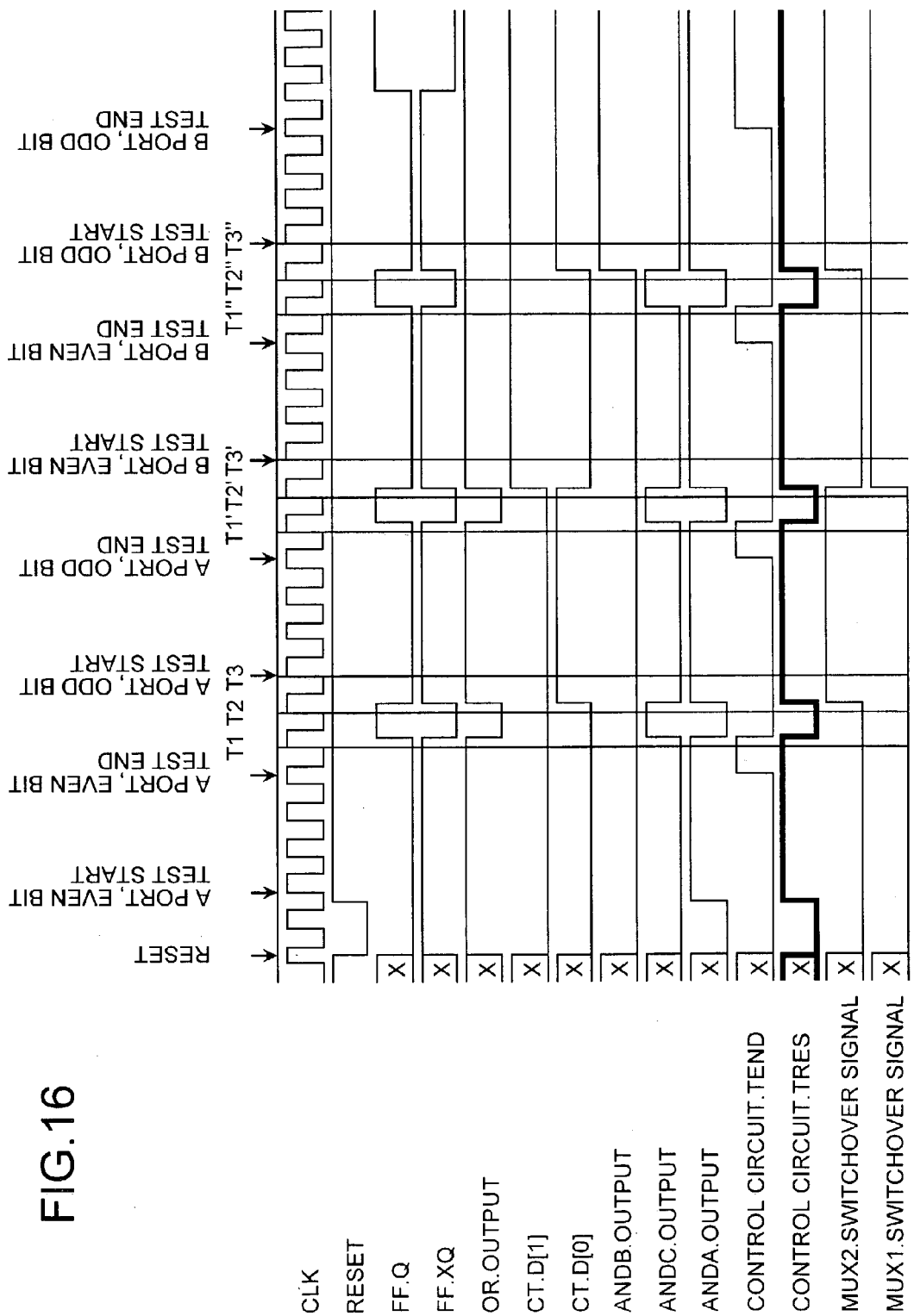
FIG. 16 is a timing chart of the operation timing of the circuit shown in FIG. 14.

FIG. 16 is a timing chart of the operation timing of the circuit shown in FIG. 14. At first, the Q output signal and XQ output signal of the FF 3043 become low and high, respectively, in synchronization with a falling edge of the reset signal RESET. The output signal of the OR 3044 becomes high. The output signal from the output terminal D[1] of the CT 3046 as the first switchover signal MUX1 (hereinafter referred to as D[1] output signal) becomes low, and the output signal from the output terminal D[0] of the CT 3046 as the second switchover signal MUX2 (hereinafter referred to as D[0] output signal) becomes low as well. Both output signals of the ANDB 3047 and the ANDC 3045 become low. The output signal of the ANDA 3041 that becomes the input signal to the reset terminal TRES of the control circuit 3042 becomes low. Further, the test end signal output from the output terminal TEND of the control circuit 3042 becomes low.

Subsequently, in synchronization with a rising edge of the reset signal RESET, the input signal to the reset terminal TRES of the control circuit 3042 (the output signal of the ANDA 3041) becomes high. The potential level of other signals remains as it is. At this point in time, a test on, for example, the even bit of the read port A is started. After the passage of several clocks, the test on the even bits of the read ports A is ended, and the test end signal becomes high.

After the passage of one clock since the test on the even bits of the read ports A is ended (at a timing indicated by T1 in FIG. 16), the Q output signal and XQ output signal of the FF 3043 become high and low, respectively. The output signal of the OR 3044 becomes low, and the input signal to the reset terminal TRES of the control circuit 3042 becomes low. The test end signal also returns to low. The output signal of the ANDC 3045 becomes high. The D[1] output signal (the first switchover signal MUX1) and D[0] output signal (the second switchover signal MUX2) of the CT 3046 both remain low. The output signal of the ANDB 3047 also remains low.

After the passage of another one clock (at a timing indicated by T2 in FIG. 16), the Q output signal and XQ output signal of the FF 3043 become low and high, respectively. The output signal of the OR 3044 becomes high, and the input signal to the reset terminal TRES of the control circuit 3042 becomes high. As a result, the reset of the control circuit 3042 is released. The test end signal remains low. The output signal of the ANDC 3045 becomes low. The D[0] output signal (the second switchover signal MUX2) of the CT 3046 changes to high. The D[1] output signal (the first switchover signal MUX1) of the CT 3046 remains low. The output signal of the ANDB 3047 also remains low.

After further passage of one clock (at a timing indicated by T3 in FIG. 16), a test on, for example, the odd bit of the read port A is started. When the test on the odd bits of the read ports A is ended, the test end signal becomes high. After the passage of one clock since then (at a timing indicated by T1' in FIG. 16), the Q output signal of the FF 3043 becomes high, the XQ output signal of the FF 3043 becomes low, the output signal of the OR 3044 becomes low, and the input signal to the reset terminal TRES of the control circuit 3042 becomes low. The test end signal returns to low. The output signal of the ANDC 3045 becomes high. The D[1] output signal (the first switchover signal MUX1) of the CT 3046 remains low. The D[0] output signal (the second switchover signal MUX2) of the CT 3046 remains high. The output signal of the ANDB 3047 also remains low.

After the passage of another one clock (at a timing indicated by T2' in FIG. 16), the Q output signal of the FF 3043 becomes low, the XQ output signal of the FF 3043 becomes high, the output signal of the OR 3044 becomes high, the input signal to the reset terminal TRES of the control circuit 3042 becomes high, and the reset of the control circuit 3042 is released. The test end signal remains low. The output signal of the ANDC 3045 becomes low. The D[0] output signal (the second switchover signal MUX2) of the CT 3046 changes to low, and the D[1] output signal (the first switchover signal MUX1) changes to high, respectively. The output signal of the ANDB 3047 remains low.

After further passage of one clock (at a timing indicated by T3' in FIG. 16), a test on, for example, the even bit of the read port B is started. When the test on the even bits of the read ports B is ended, the test end signal becomes high. After the passage of one clock since then (at a timing indicated by T1" in FIG. 16), the Q output signal of the FF 3043 becomes high, the XQ output signal of the FF 3043 becomes low, the input signal to the reset terminal TRES of the control circuit 3042 becomes low, and the test end signal returns to low. The output signal of the OR 3044 remains high. The output signal of the ANDC 3045 becomes high. The D[1] output signal (the first switchover signal MUX1) of the CT 3046 remains high. The D[0] output signal (the second switchover signal MUX2) of the CT 3046 remains low. The output signal of the ANDB 3047 remains low.

After the passage of another one clock (at a timing indicated by T2" in FIG. 16), the Q output signal of the FF 3043 becomes low, the XQ output signal of the FF 3043 becomes high, and the input signal to the reset terminal TRES of the control circuit 3042 becomes high, thereby the reset of the control circuit 3042 is released. The output signal of the OR 3044 remains high, while the test end signal remains low. The output signal of the ANDC 3045 becomes low. The D[0] output signal (the second switchover signal MUX2) of the CT 3046 changes to high, and the D[1] output signal (the first switchover signal MUX1) remains high. The output signal of the ANDB 3047 changes to high.

After further passage of one clock (at a timing indicated by T3" in FIG. 16), a test on, for example, the odd bit of the read port B is started. When the test on the odd bits of the read ports B is ended, the test end signal becomes high. After the passage of one clock, the Q output signal and XQ output signal of the FF 3043 change to respective levels. The potential level of other signals remains as it is.

According to the third embodiment described above, the number of the signature analyzers 101 and the number of the 1-bit comparators 11 decrease, by sharing one signature analyzer 1 with two read ports of the RAM macro 5 and further sharing one 1-bit comparator 11 with two data output bits of each read port. As a result, the size (the number of gates) of the BIST circuit can be further reduced as compared to that of the first embodiment and the second embodiment.

In the third embodiment, the test on the read ports B of the RAM macro 5 is carried out first, and then the test on the read ports A may be carried out. Further, the test on the odd bits of the data output bits of each read port is carried out first, and then the test on the even bits may be carried out. Alternatively, the configuration may be such that one signature analyzer 101 is shared with at least three read ports of the RAM macro 5, or that one 1-bit comparator 11 is shared with at least three data output bits of each read port.

Figure 17:
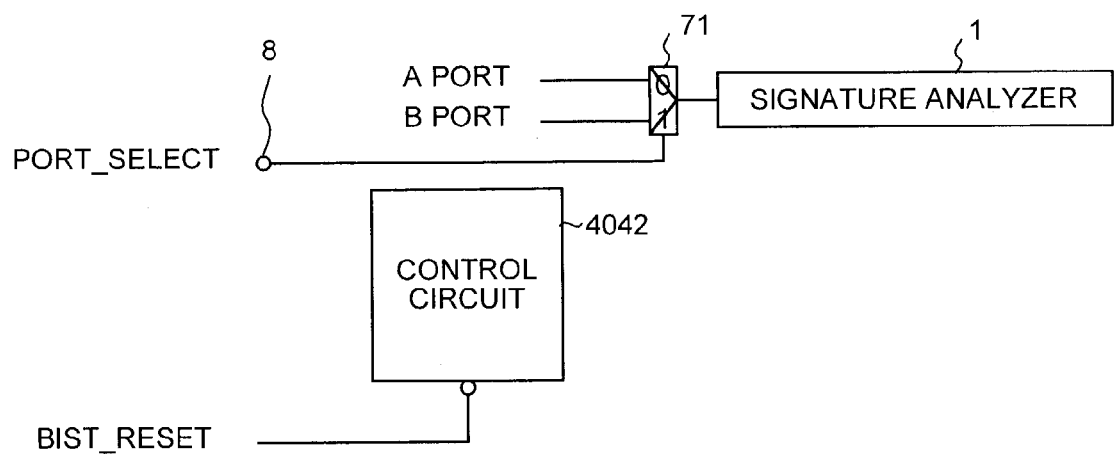
FIG. 17 is a circuit diagram showing one example of the configuration in which the port selector in the RAMBIST circuit according to the present invention is controlled by a control signal from outside.

The present invention is not limited to the embodiments described above, and can be variously changed. For example, the selection operation of the read ports by the selector 71 of the port selector 7 or the selection operation of the data output bits by each selector 61 of the bit changer 6 may be controlled not by the controller but by a control signal input from outside. In this case, as shown in FIG. 17, it is necessary to provide a terminal 8 for inputting the control signal from outside. A reset signal BIST_RESET is input to the control circuit 4042. It is appropriately selected whether to control the selection operation by the control circuit or by a control signal from outside, considering a cost and the like.

Figure 18:
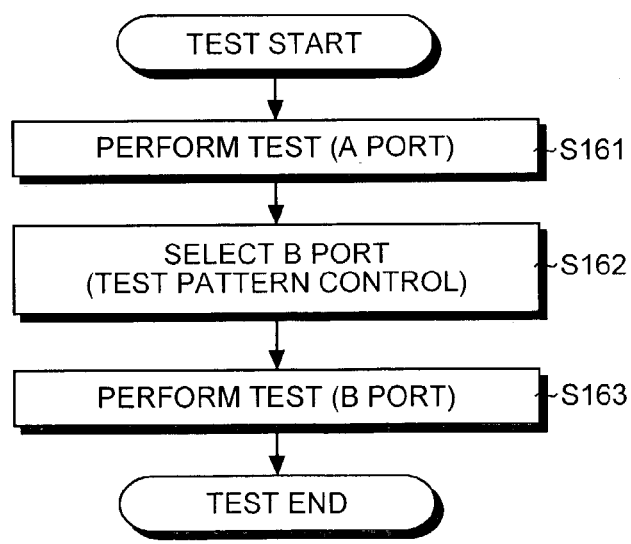
FIG. 18 is a flowchart showing one example of a test sequence executed in the circuit shown in FIG. 17.

A test sequence is explained using an example in which the selection operation of the read port is controlled by a control signal from outside. In FIG. 18, at first, a test on the read port A is carried out (step S161). After ending the test, the read port B is selected by the port selector 7 (step S162), and a test is carried out on the read port B (step S163), thereby ending the test. Here, the end of the test on the read port A is determined by counting the number of clocks, using a test pattern, and hence it is necessary to prepare the test pattern. The same manner is applied to the case where the selection operation of the data output bits is controlled by a control signal from outside.

According to the present invention, the 1-bit comparator of the signature analyzer is shared with data output bits of the circuit to be tested, or the signature analyzer is shared with data output ports of the circuit to be tested, and therefore the number of 1-bit comparators and the number of signature analyzers are decreased. Thus, it is advantageous that the size (number of gates) of the BIST circuit can be reduced.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A built-in self-test (BIST) circuit that is included in a large-scale integrated circuit (LSI) for testing a random-access memory (RAM) that outputs a plurality of bit sets each of which includes a plurality of bits, comprising:
   a selector that is supplied with one of the bit sets and selects the bits in the bit set one by one;
   a 1-bit comparator that compares a bit selected by the selector with expected value data;
   a data generator that supplies the expected value data to the 1-bit comparator; and
   a controller that controls the data generator to generate the expected value data, wherein
   a pair of the selector and the 1-bit comparator is provided to each of the bit sets.

2. The BIST circuit according to claim 1, wherein the controller includes a logic circuit that controls the selector to select a first bit in the bit set, and then select a second bit in the bit set after a test on the first bit is completed.

3. The BIST circuit according to claim 1, wherein the selector selects two bits in the bit set one by one.

4. The built-in self-test (BIST) circuit according to claim 1, further comprising a control terminal to which a control signal is input, wherein the control signal controls the selector to select a first bit in the bit set, and then select a second bit in the bit set after a test on the first bit is completed.

5. A built-in self-test (BIST) circuit that is included in a large-scale integrated circuit (LSI) for testing a random-access memory (RAM) that outputs a plurality of bit sets, each of which includes a plurality of bits, so that the bits in each of the bit sets are output through different ports of the RAM comprising:
   a selector that is supplied with one of the bit sets and selects the bits in the bit set one by one;
   a 1-bit comparator that compares a bit selected by the selector with expected value data;
   a data generator that supplies the expected value data to the 1-bit comparator; and
   a controller that controls the data generator to generate the expected value data, wherein
   a pair of the selector and the 1-bit comparator is provided for each of the bit sets.

6. The BIST circuit according to claim 5, wherein the controller includes a logic circuit that controls the selector to select a first bit in the bit set, and then select a second bit in the bit set after a test on the first bit is completed.

7. The BIST circuit according to claim 5, wherein the selector selects two bits in the bit set one by one.

8. The built-in self-test (BIST) circuit according to claim 5, further comprising a control terminal to which a control signal is input, wherein the control signal controls the selector to select a first bit in the bit set, and then select a second bit in the bit set after a test on the first bit is completed.

9. A built-in self-test (BIST) circuit that is included in a large-scale integrated circuit (LSI) for testing a random-access memory (RAM) that outputs a plurality of bit sets, each of which includes a plurality of bits, so that the bits in each of the bit sets are output through different ports of the RAM comprising:
   a first selector that is supplied with a first bit set of the bit sets and selects the bits in the first bit set one by one;
   a second selector that is supplied with a second bit set of the bit sets and selects the bits in the second bit set one by one;
   a third selector that is connected to the first selector and the second selector and selects the bits selected by the first selector and the second selector one by one;
   a 1-bit comparator that is connected to the third selector and compares a bit selected by the third selector with expected value data;
   a data generator that supplies the expected value data to the 1-bit comparator; and
   a controller that controls the data generator to generate the expected value data, wherein
   a set of the first selector, the second selector, the third selector, and the 1-bit comparator is provided for every predetermined number of bit sets.

10. The BIST circuit according to claim 9, wherein the controller includes a logic circuit that controls
    the first selector to select a first bit in the first bit set,
    the second selector to select a second bit in the second bit set,
    the third selector to select the first bit and then select the second bit after a test on the first bit is completed,
    the first selector to select a third bit in the first bit set after a test on the second bit is completed,
    the second selector to select a fourth bit in the second bit set, and
    the third selector to select the third bit, and then select the fourth bit after a test on the third bit is completed.

11. The BIST circuit according to claim 9, wherein the first selector selects two bits in the first bit set one by one and the second selector selects two bits in the second bit set one by one.

12. The BIST circuit according to claim 9, wherein the third selector selects two bits selected by the first selector and the second selector one by one.

13. The built-in self-test (BIST) circuit according to claim 9, further comprising a control terminal to which a control signal is input, wherein the control signal controls
    the first selector to select a first bit in the first bit set, the second selector to select a second bit in the second bit set, the third selector to select the first bit, and then select the second bit after a test on the first bit is completed, the first selector to select a third bit in the first bit set after a test on the second bit is completed, the second selector to select a fourth bit in the second bit set, and the third selector to select the third bit, and then select the fourth bit after a test on the third bit is completed.

* * * * *